United States Patent
Nakamura et al.

(10) Patent No.: US 6,914,294 B2
(45) Date of Patent: Jul. 5, 2005

(54) SEMICONDUCTOR DEVICE

(75) Inventors: Kazutoshi Nakamura, Kanagawa (JP); Tomoko Matsudai, Tokyo (JP); Yusuke Kawaguchi, Kanagawa (JP); Akio Nakagawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 1 day.

(21) Appl. No.: 10/438,069

(22) Filed: May 15, 2003

(65) Prior Publication Data

US 2004/0159891 A1 Aug. 19, 2004

(30) Foreign Application Priority Data

Feb. 18, 2003 (JP) ........................................ 2003-039765

(51) Int. Cl.$^7$ ............................................. H01L 31/113
(52) U.S. Cl. .................... 257/328; 527/327; 527/336; 527/401; 438/212; 438/268
(58) Field of Search .................. 257/327, 328, 257/336, 401, 492, 368, 204, 350, 511; 438/212, 268, 284, 286

(56) References Cited

U.S. PATENT DOCUMENTS

| | | | |
|---|---|---|---|
| 5,146,298 A | | 9/1992 | Eklund |
| 5,514,608 A | * | 5/1996 | Williams et al. ............ 438/286 |
| 5,912,495 A | * | 6/1999 | Depetro et al. ............. 257/355 |
| 6,288,424 B1 | * | 9/2001 | Ludikhuize ................. 257/335 |
| 2002/0017697 A1 | * | 2/2002 | Kitamura et al. ........... 257/492 |
| 2002/0053695 A1 | * | 5/2002 | Liaw et al. ................. 257/328 |

FOREIGN PATENT DOCUMENTS

JP 2002-158348 5/2002

OTHER PUBLICATIONS

A. W. Ludikhuize, Proceedings of the 14$^{th}$ International Symposium on Power Semiconductor Devices & ICS, pp. 301–304, "Lateral 10–15V DMOST with Very Low 6 MOHM.MM2 On–Resistance", 2002.

* cited by examiner

*Primary Examiner*—David Nelms
*Assistant Examiner*—Long Tran
(74) *Attorney, Agent, or Firm*—Oblon, Spivak, McClelland, Maier & Neustadt, P.C.

(57) ABSTRACT

A semiconductor device comprises a semiconductor substrate having a main surface; a semiconductor layer of a first conduction type provided on the main surface of said semiconductor substrate; a first buried layer of the first conduction type provided between said semiconductor layer and said semiconductor substrate; a first connection region of the first conduction type provided around said first buried layer, said first connection region extending from the surface of said semiconductor layer to said first buried layer; a switching element provided in the surface region of said semiconductor layer on said first buried layer; and a low breakdown-voltage element provided in a surface region of said semiconductor layer, said low breakdown-voltage element being closer to said first connection region than said switching element and having lower breakdown voltage than that of said switching element.

12 Claims, 9 Drawing Sheets

SEMICONDUCTOR DEVICE

CROSS-REFERENCE TO RELATED APPLICATION

This application is based upon and claims the benefit of priority from the prior Japanese Patent Application No. 2003-39765, filed on Feb. 18, 2003, the entire contents of which are incorporated herein by reference.

BACKGROUND OF THE INVENTION

1. Field of the Invention

The present invention relates to a semiconductor device.

2. Related Background Art

Hitherto, an LDMOS (Lateral Double Diffused Metal Oxide Semiconductor) has been frequently used in a power integrated circuit. The LDMOS is a semiconductor device capable of switching heavy current.

FIG. 8 is a circuit diagram showing a general DC-DC converter using an LDMOS. This DC-DC converter employs a synchronous back converter. The current source of high voltage Vcc is connected to the drain electrode of an LDMOS 1, and a ground GND is connected to a source electrode of an LDMOS 2. A current is supplied from a node N between the LDMOSs 1 and 2 to a load via a filter.

An input signal is supplied to a gate electrode of each of the LDMOSs 1 and 2 from a control circuit. The control circuit controls an input IN1 of the LDMOS 1 and an input IN2 of the LDMOS 2 so that the LDMOSs 1 and 2 are not in the ON state simultaneously.

When the LDMOS 1 is ON, current is supplied from the current source of the voltage Vcc to the load. Due to existence of an inductance L, when the LDMOS 1 changes from the ON state to the OFF state, regenerative current flows from the ground GND to the load via a Shottky barrier diode SBD as shown by the arrow in FIG. 8. It can prevent the potential of the drain of the LDMOS 2 from becoming lower than the potential of the ground to a certain extent.

On the other hand, when a high voltage is applied to the drain of the LDMOS 2, the Schottky barrier diode SBD does not act. The operation of the LDMOS 2 in this case will be described later with reference to FIG. 9.

FIG. 9 is an enlarged sectional view of the LDMOS 2. The LDMOS 2 includes a P-type silicon substrate 910, an N$^-$-type semiconductor layer 920, a P-type semiconductor layer 930, a P-type buried layer 940, an N-type buried layer 950, a P-type connection region 960, and an N-type connection region 970.

Multiple P-type base layers 980, N$^+$-type source layers 982, N$^+$-type drain layers 986, and N$^-$-type field relaxation layers 984 are formed in the surface region of the semiconductor layer 930. Further, a gate electrode, a source electrode, and a drain electrode are formed on the surface of the semiconductor layer 930.

The operation of the LDMOS 2 in the case where a high voltage is applied to the drain electrode will be described. When a high voltage is applied to the drain electrode, a depletion layer extends from a junction between the field relaxation layers 984 and the base layers 980 or a junction between the field relaxation layers 984 and semiconductor layer 930. When the depletion layer reaches the drain layers 986, avalanche breakdown occurs at an end of the drain layers 986. By the avalanche breakdown, electrons move into the drain layers 986 and holes move into the base layers 980 or buried layers 940.

The N$^+$-type drain layers 986, P-type semiconductor layer 930, and N-type buried layer 950 construct a parasitic NPN bipolar transistor BPT. Since the semiconductor layer 930 acts as the base of the parasitic bipolar transistor BPT, when holes move into the semiconductor layer 930, the parasitic bipolar transistor BPT can be activated.

When a high voltage is applied to the drain electrode, the depletion layer extends also to the semiconductor layer 930. It makes the semiconductor layer 930 seemingly thinner. Since the semiconductor layer 930 acts as the base of the parasitic bipolar transistor BPT, reduction in the seeming thickness of the semiconductor layer 930 corresponds to reduction in the width of the base of the parasitic bipolar transistor BPT. As a result, the gain of the parasitic bipolar transistor BPT increases, so that the parasitic bipolar transistor BPT is activated more easily.

In this case, since the Schottky diode SBD shown in FIG. 8 does not operate, when the parasitic bipolar transistor BPT is activated, a large unavailable current flows from the drain to the ground. The unavailable current represents a waste of power.

The P-type buried layer 940 can prevent activation of the parasitic bipolar transistor BPT to a certain extent in the case where a high voltage is applied to the drain electrode. Since impurity concentration of the P-type buried layer 940 is higher than that of the semiconductor layer 930, the base resistance is lowered. Therefore, an effect of decreasing the gain of the parasitic bipolar transistor BPT is produced. As a result, it reduces the tendency of activation of the parasitic bipolar transistor BPT. The buried layer 940 is electrically connected to the buried layer 950 by a short-circuit plug. Therefore, the holes generated by the avalanche breakdown are discharged from the buried layer 940 to the ground GND via the connection region 960. As a result, a potential difference between the buried layers 940 and 950 can be decreased, and it reduces the tendency of activation of the parasitic bipolar transistor BPT.

However, since the connection region 960 is formed around the LDMOS 2, the distance of drifting of holes in the buried layer 940 is long. Particularly, the drift distance of holes moved from the center portion of the LDMOS 2 is longer as compared with that of holes moved from the peripheral portion. When the drift distance of holes is long, the potential difference occurs between the buried layers 940 and 950 at distance from the peripheral part. As a result, the parasitic bipolar transistor BPT is activated. Particular, when the device area of the LDMOS 2 is large, the drift distance of holes becomes long, so that the possibility that the parasitic bipolar transistor BPT is activated increases.

To make the parasitic bipolar transistor BPT inactive, there is a method of short-circuiting the drain layer 986 and the buried layer 950 by omitting the buried layer 940 and the connection region 960 and connecting the drain electrode to the short-circuit plug without connecting the source electrode to the short-circuit plug. However, when the potential of the drain becomes lower than that of the source, a diode constructed by the silicon substrate 910 and the buried layer 950 is biased in the forward direction. It makes current flow to the silicon substrate 910. The current flowing in the silicon substrate 910 is called a substrate current, which exerts an adverse influence on peripheral logic circuits in the semiconductor chip such as the control circuit shown in FIG. 1.

Therefore, a semiconductor device with reduced unavailable current and suppressed substrate current is desired.

SUMMARY OF THE INVENTION

A semiconductor device comprises a semiconductor substrate having a main surface; a semiconductor layer of a first conduction type provided on the main surface of said semiconductor substrate; a first buried layer of the first conduction type provided between said semiconductor layer and said semiconductor substrate; a first connection region of the first conduction type provided around said first buried layer, said first connection region extending from the surface of said semiconductor layer to said first buried layer; a switching element provided in the surface region of said semiconductor layer on said first buried layer; and a low breakdown-voltage element provided in a surface region of said semiconductor layer, said low breakdown-voltage element being closer to said first connection region than said switching element and having lower breakdown voltage than that of said switching element.

DETAILED DESCRIPTION OF THE INVENTION

Embodiments of the invention will be described hereinbelow with reference to the drawings. The invention is not limited to the embodiments.

Figure 1:
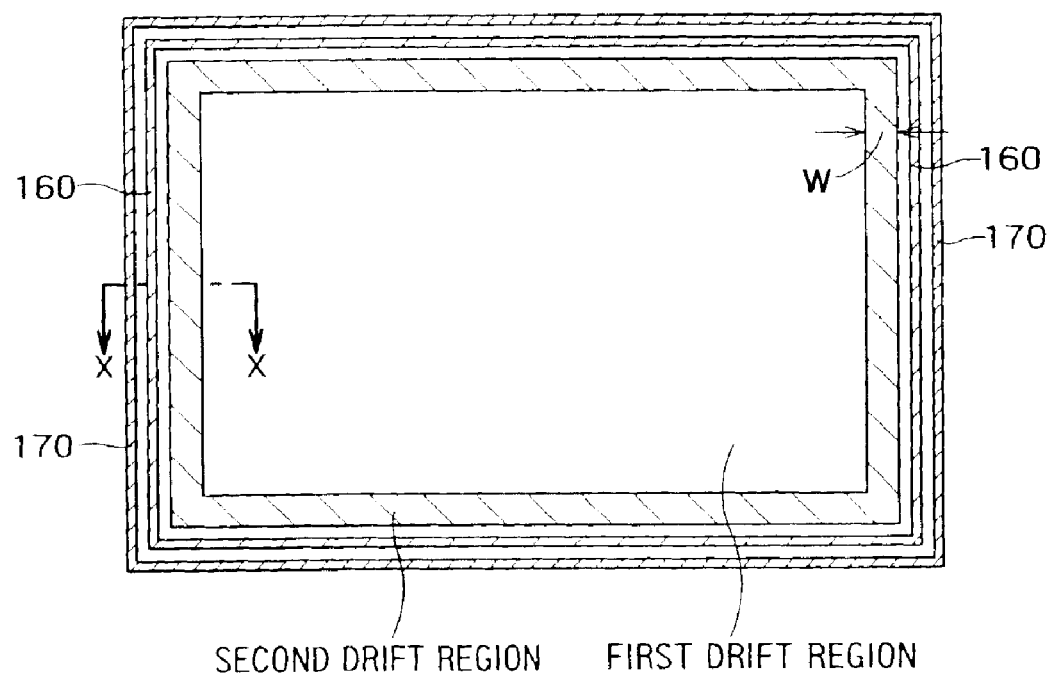
FIG. 1 is a plan view of an LDMOS region according to an embodiment of the invention.

FIG. 1 is a plan view of an LDMOS region according to an embodiment of the invention. The LDMOS region is divided into a first drift region and a second drift region. The second drift region is provided so as to surround the first drift region. A P-type connection region 160 is provided so as to surround the second drift region. Further, an N-type connection region 170 is provided so as to surround the connection region 160. Around the connection region 170, peripheral logic circuits (not shown) such as a control circuit for controlling the LDMOS are provided.

The second drift region is interposed between the first drift region and the connection region 160 in each of the plane regions shown in FIG. 1. In other wards, the second drift region is provided close to the connection region 160 more than the first drift region.

LDMOS is an example of a lateral-type semiconductor device.

FIGS. 2 to 6 are enlarged cross sections each taken along line X—X of the LDMOS region shown in FIG. 1. The LDMOS is an embodiment of a lateral-type semiconductor device.

Figure 2:
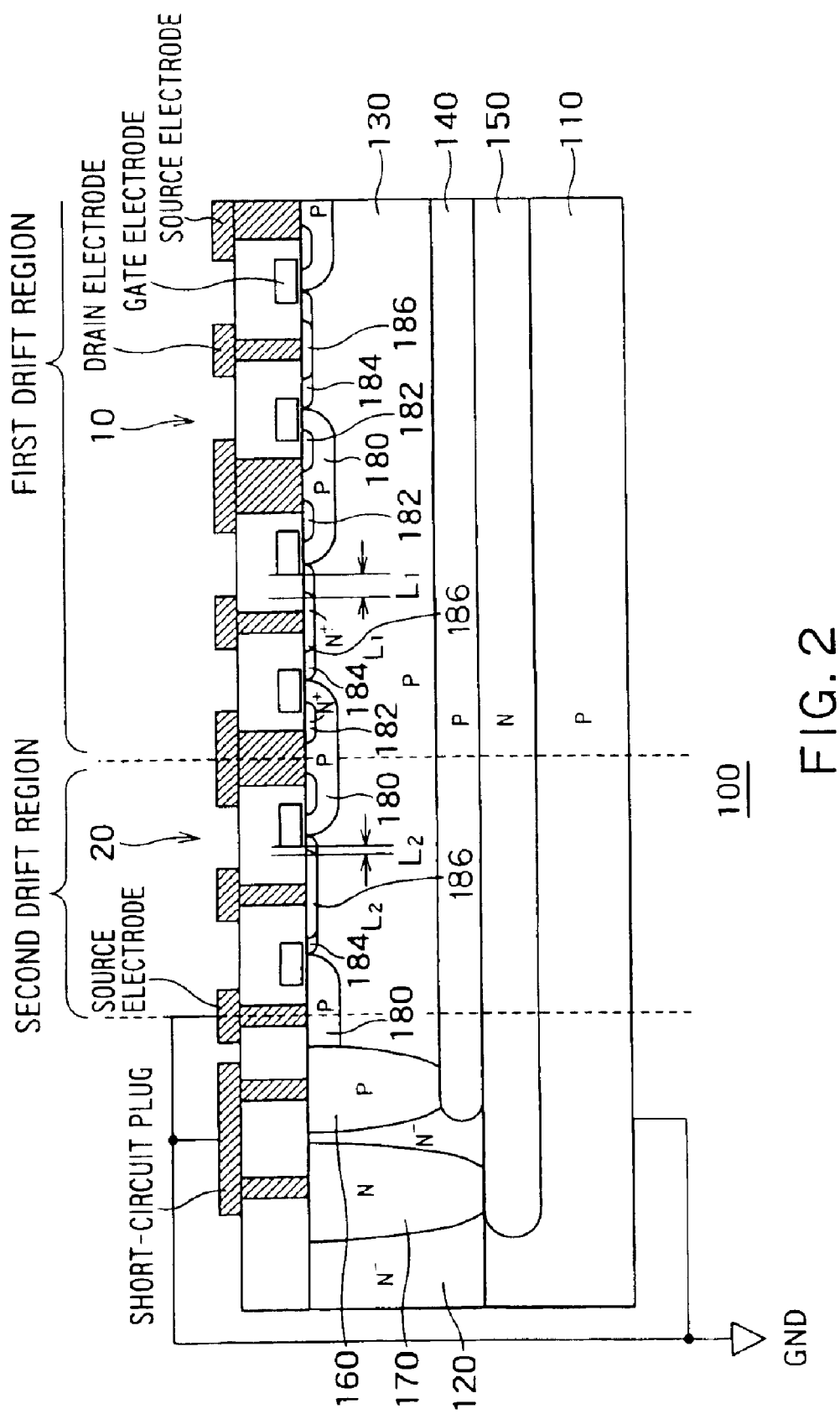
FIG. 2 is a cross section of a semiconductor device 100 according to a first embodiment of the invention.

FIG. 2 is a cross section of a semiconductor device 100 according to a first embodiment of the invention. Since a heavy current is passed, a number of LDMOSs are provided in the first drift region. Each of FIGS. 2 to 6 shows a part of the LDMOSs. An LDMOS 10 formed in the first drift region has a P-type silicon substrate 110, an N$^-$-type semiconductor layer 120, a P-type semiconductor layer 130, a P-type buried layer 140, an N-type buried layer 150, a P-type connection region 160, and an N-type connection region 170.

The semiconductor layer 120 is an N$^-$-type epitaxial layer provided on the silicon substrate 110. The semiconductor layer 130 is a P-type well diffusion layer provided in the semiconductor layer 120.

The buried layers 140 and 150 are provided between the semiconductor substrate 110 and the semiconductor layer 130. The connection region 160 is provided so as to connect the surface of the semiconductor layer 130 to the buried layer 140. The connection region 170 is provided so as to connect the surface of the semiconductor layer 130 to the buried layer 150.

A P-type base layer 180, an N$^+$-type source layer 182, an N$^-$-type field relaxation layer 184, and an N$^+$-type drain layer 186 are provided in the surface region of the semiconductor layer 130. The field relaxation layer 184 is provided in the surface of the semiconductor layer 130 and is apart from the source layer 182. The drain layer 186 is provided in the surface of the semiconductor layer 130 in the field relaxation layer 184 and is apart from the base layer 180. Further, a gate electrode, a source electrode, and a drain electrode are provided on the surface of the semiconductor layer 130.

On the other hand, an LDMOS 20 formed in the second drift region is different from an LDMOS 10 with respect to the width in the lateral direction of the field relaxation layer 184. The other elements of the LDMOS 20 are the same as those in the LDMOS 10. The lateral direction denotes a direction in which charges flow in the channel just below the gate electrode. In other words, the lateral direction denotes the direction from the drain layer 186 to the source layer 182 or the opposite direction. "Width" denotes length in the lateral direction.

The field relaxation layer 184 in the LDMOS 20 is narrower in width than the field relaxation layer 184 in the LDMOS 10. That is, the length of the field relaxation layer 184 extending from an end of the drain layer 186 to the source layer 182 in the LDMOS 20 is shorter than the length of that in the LDMOS 10.

In the embodiment, the pitch between gate electrodes in the first drift region and that in the second drift region are the same. Therefore, at the time point when the field relaxation layer 184 is formed in a self-aligned manner by using the gate electrodes, the width of the field relaxation layer 184 in the LDMOS 10 and that in the LDMOS 20 are almost equal to each other.

The drain layer 186 in the LDMOS 20 is formed to be wider than the drain layer 186 of the LDMOS 10 in the field relaxation layer 184 by using the photolithography technique. As a result, after formation of the drain layer 186, the width of the field relaxation layer 184 in the LDMOS 20 is narrower than that of the LDMOS 10. That is, in the embodiment, the width of the field relaxation layer 184 is controlled by the width of the drain layer 186.

Generally, the breakdown voltage between the source and drain of the LDMOS is determined by the length of the field relaxation layer extending from an end of the drain layer to an end of the gate electrode. For example, the breakdown voltage of the LDMOS 10 is determined by $L_1$. The breakdown voltage of the LDMOS 20 is determined by $L_2$. $L_1$ denotes the length of the field relaxation layer extending from the end of the drain layer to the end of the gate electrode in the LDMOS 10. $L_2$ denotes the length of the field relaxation layer extending from the end of the drain layer in the LDMOS 20 to the end of the gate electrode.

Figure 8:
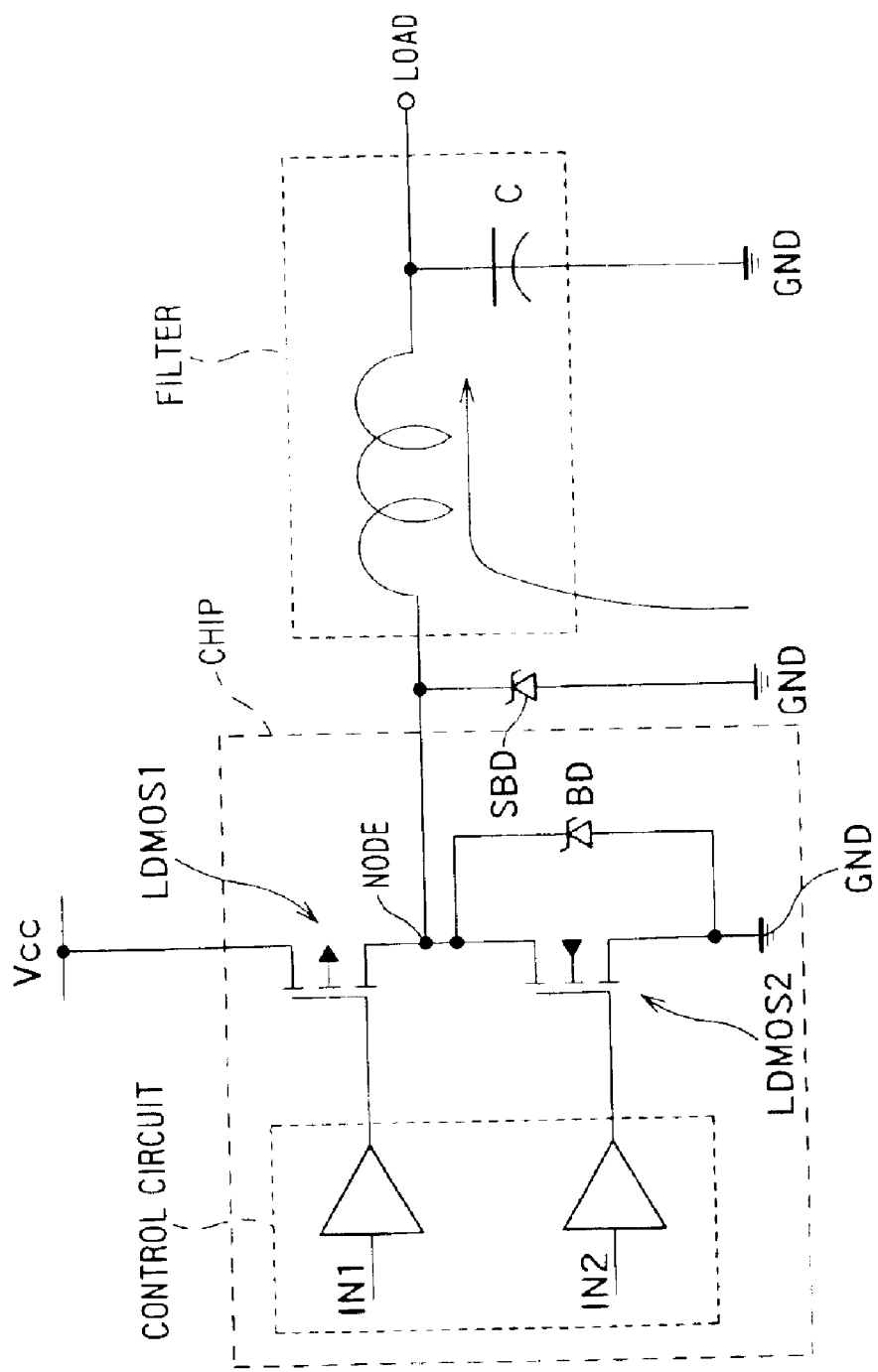
FIG. 8 is a circuit diagram of a general DC-DC converter using an LDMOS.
Figure 9:
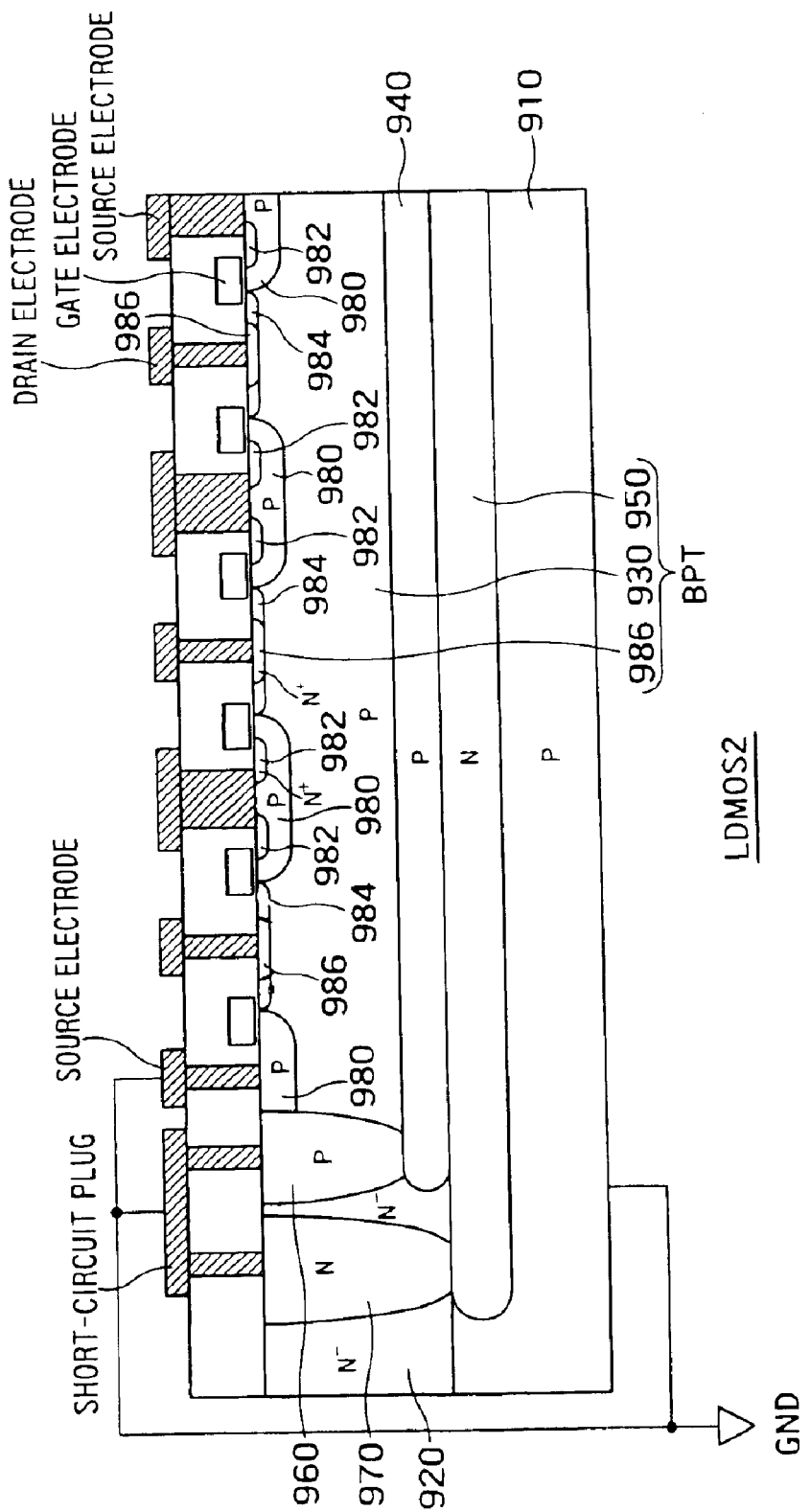
FIG. 9 is an enlarged cross section of an LDMOS 2.

According to the embodiment, the width of the field relaxation layer 184 in the LDMOS 20 after formation of the drain layer 186 is narrower than that in the LDMOS 10, so that $L_2$ is smaller than $L_1$. Therefore, the breakdown voltage of the LDMOS 20 is lower than that of the LDMOS 10. For example, in FIG. 8, in the case where the LDMOSs 10 and 20 are turned on simultaneously and a high voltage or heavy current is supplied to the drain electrode, avalanche breakdown occurs in the LDMOS 20 earlier than that in LDMOS 10. Therefore, the current passes through the LDMOS 20 without passing through the LDMOS 10, further passes through the buried layer 140 and the connection region 160, and flows to the ground GND. As shown in FIG. 1, the second drift region is provided near the connection region 160. Therefore, the drift distance of holes in the buried layer 140 becomes relatively short, so that a potential difference occurring between the buried layers 140 and 150 becomes smaller than that in the conventional case. As a result, the parasitic NPN bipolar transistor constructed by the $N^+$-type drain layers 186, P-type semiconductor layer 130, P-type buried layer 140, and N-type buried layer 150 is not easily activated. The parasitic bipolar transistor is maintained inactive as described above, so that unavailable current flowing in the LDMOSs 10 and 20 is reduced.

In the embodiment, the source electrode is connected to the short-circuit plug. Consequently, when a potential lower than the potential of ground is applied to the drain electrode, a substrate current does not flow to the silicon substrate 110. Therefore, the embodiment does not exert an adverse influence on the peripheral logic circuits.

Figure 3:
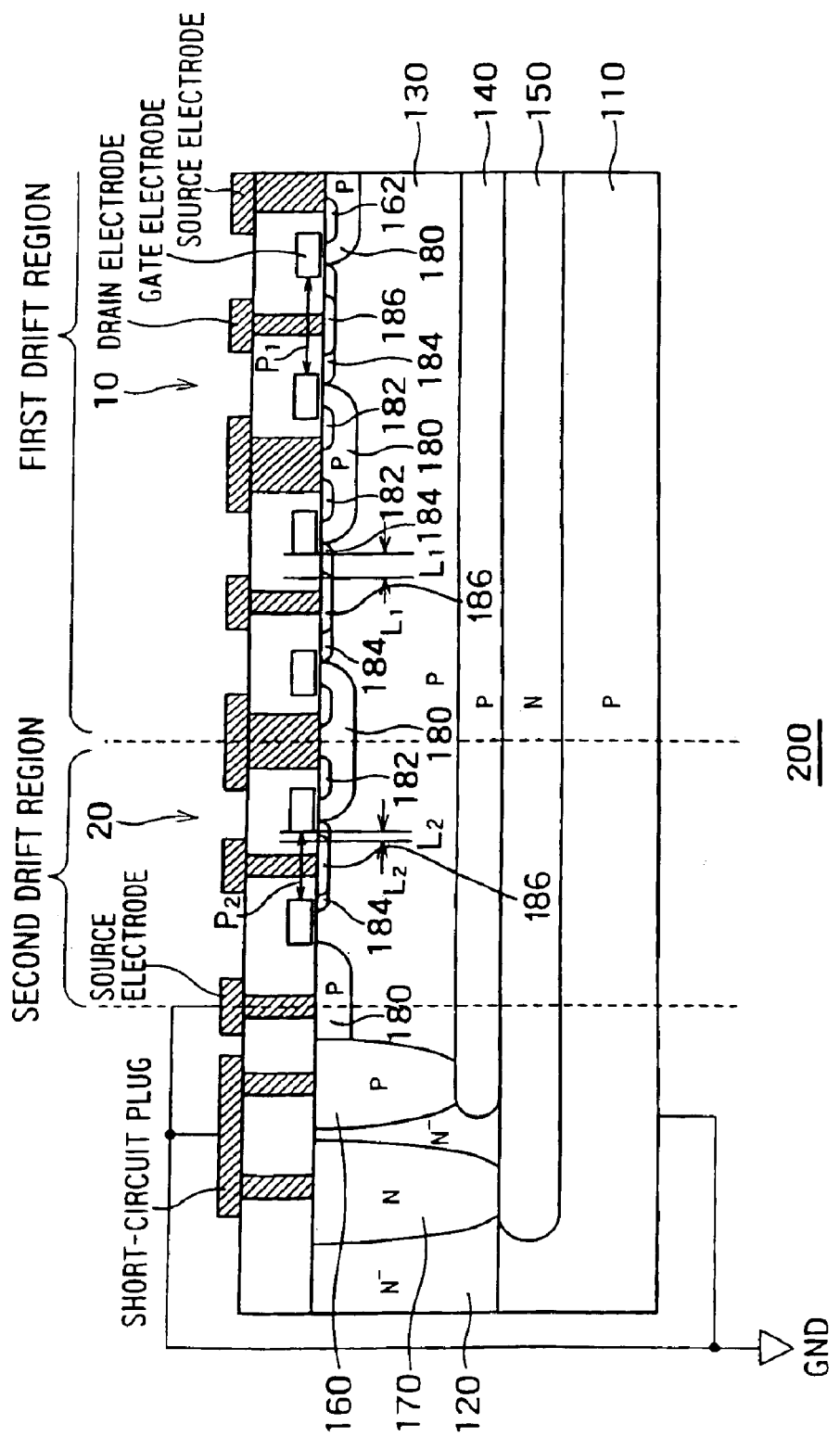
FIG. 3 is a cross section of a semiconductor device 200 according to a second embodiment of the invention.

FIG. 3 is a cross section of a semiconductor device 200 according to a second embodiment of the invention. In the first embodiment, the pitch between gate electrodes in the second drift region and that in the first drift region are the same. The second embodiment, however, is different from the first embodiment with respect to the point that a pitch P2 between the gate electrodes in the second drift region is narrower than a pitch P1 between gate electrodes in the first drift region.

With the configuration, at the time point when the field relaxation 184 is formed in a self-aligned manner by using the gate electrodes, the width of the field relaxation layer 184 is already narrower than that of the field relaxation layer 184. As a result, the width of the field relaxation layer 184 in the LDMOS 20 can be made narrower than that of the LDMOS 10 without changing the width of the drain layer 186. That is, in the second embodiment, the width of the field relaxation layer 184 is controlled by the pitch between the gate electrodes.

According to the second embodiment, the pitch P2 is higher than the pitch P1, so that $L_2$ is smaller than $L_1$. In the second embodiment, therefore, effects similar to those of the first embodiment are produced.

In the first and second embodiments, the field relaxation layer 184 is formed in a self-aligned manner by using the gate electrodes as a mask. Alternately, the field relaxation layer 184 can be also formed by using a resist mask by the photolithography technique. In this case, the width of the field relaxation layer 184 is controlled by the resist mask.

Figure 4:
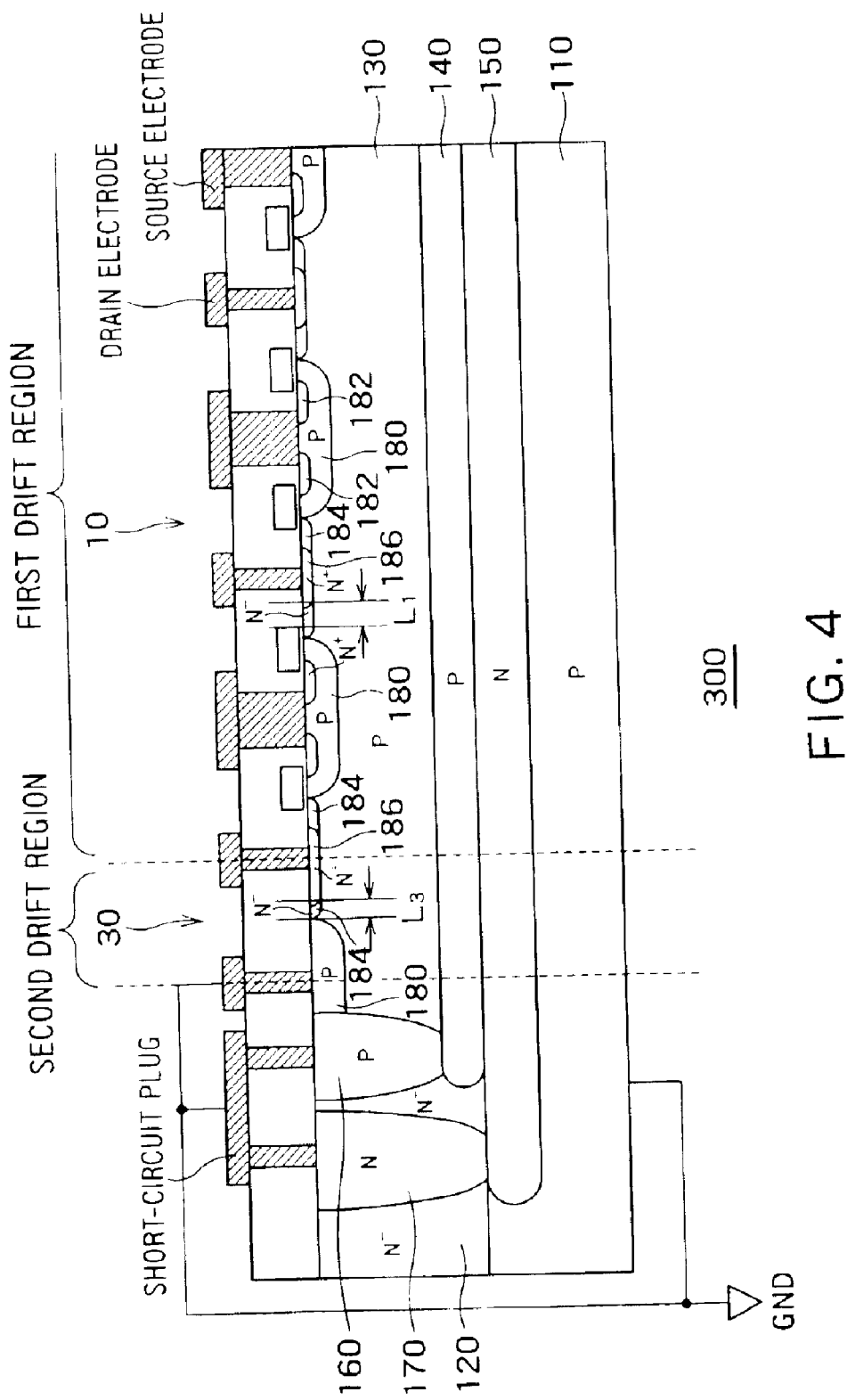
FIG. 4 is a cross section of a semiconductor device 300 according to a third embodiment of the invention.

FIG. 4 is a cross section of a semiconductor device 300 according to a third embodiment of the invention. The third embodiment is different from the first and second embodiments with respect to the point that no gate electrode is formed in the second drift region. Therefore, in the third embodiment, no LDMOS is formed in the second drift region and a diode 30 is formed by the $N^-$-type field relaxation layer 184 and the P-type base layer 180.

In the second drift region, length $L_3$ of the field relaxation layer 184 extending from an end of the drain layer 186 in the lateral direction is shorter than $L_1$. Therefore, the breakdown voltage of the diode 30 is lower than that of the LDMOS 10. As a result, the third embodiment produces effects similar to those of the first and second embodiments.

$L_3$ can be made shorter than $L_1$ by increasing the width of the drain layer 186 in the second drift region. $L_3$ may be set to be shorter than $L_1$ by narrowing the width itself of the field relaxation layer 184 in the second drift region without changing the width of the drain layer 186.

The breakdown voltage of the LDMOS 10 is determined by the length of the field relaxation layer 184 from an end of the drain layer 186 to an end of the gate electrode. However, the breakdown voltage of the diode 30 is determined by the length of the field relaxation layer 184 extending from an end of the drain layer 186, because the diode 30 has no gate electrode.

Since the breakdown voltage of the diode 30 is lower than that of the LDMOS 10, the third embodiment produces effects similar to those of the first and second embodiments. According to the third embodiment, the diode 30 in the second drift region can protect the LDMOS 10 in the first drift region. For example, in the case where a large voltage is applied to the drain electrode by ESD or the like, the parasitic NPN transistor, which is constructed by the drain layer 186, semiconductor layer 130, and buried layers 140 and 150 in the second drift region, is activated more easily as compared with a similar parasitic NPN transistor in the first drift region. Therefore, by making current concentrated on the diode 30, the LDMOS 10 can be protected from the ESD and the like.

Figure 5:
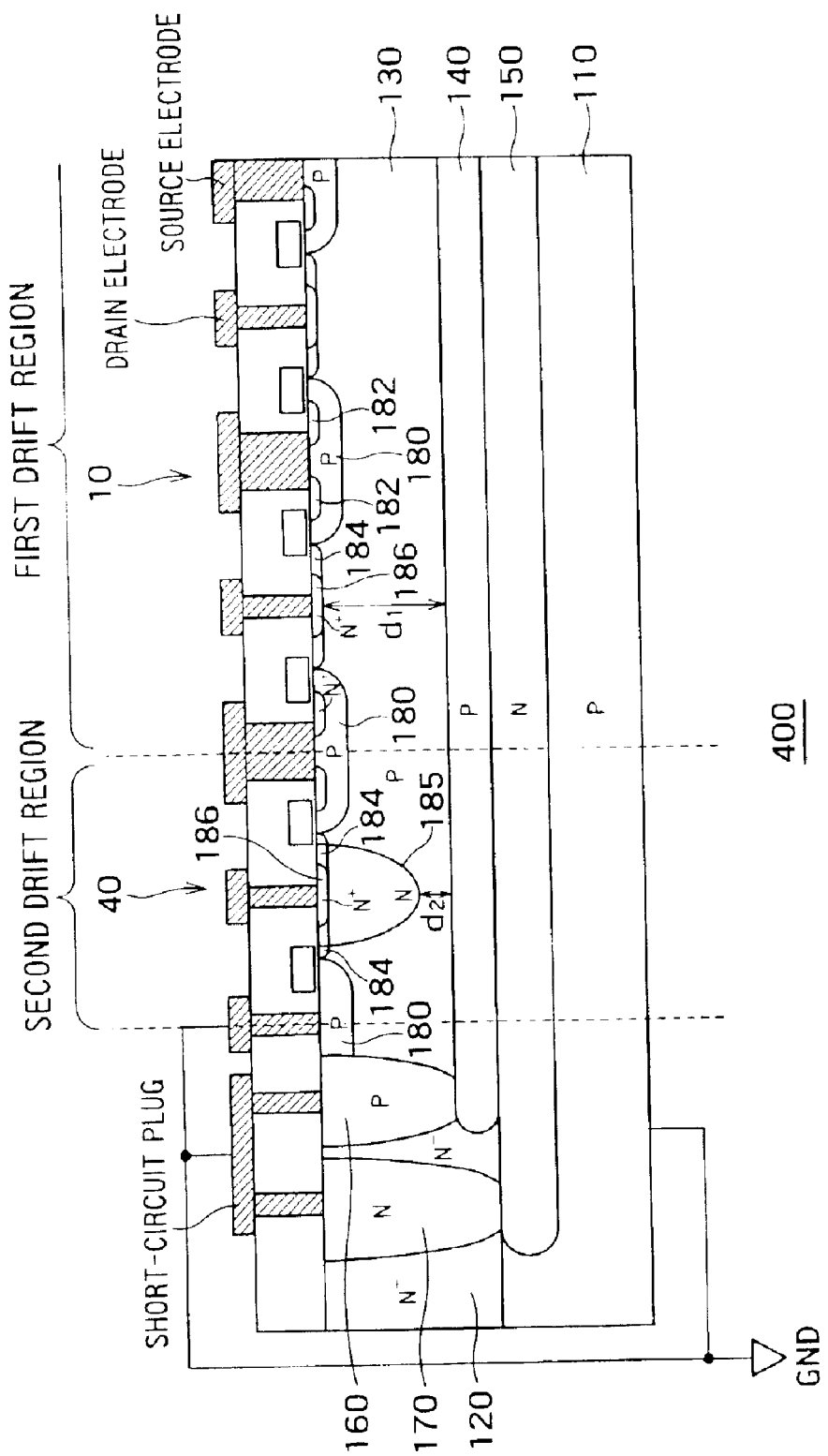
FIG. 5 is a cross section of a semiconductor device 400 according to a fourth embodiment of the invention.

FIG. 5 is a cross section of a semiconductor device 400 according to a fourth embodiment of the invention. The fourth embodiment is different from the first embodiment with respect to the point that a deep layer 185 is provided in the second drift region. The fourth embodiment is also different from the first embodiment with respect to the point that the width of the field relaxation layer 184 and the width of the drain layer 186 in the second drift layer are the same as those in the first drift layer.

Distance d2 from the lower end of the deep layer 185 to the buried layer 140 is shorter than distance d1 from the lower end of the field relaxation layer 184 or drain layer 186 to the buried layer 140. The impurity concentration of the deep layer 185 is higher than that of the field relaxation layer 184. Therefore, a depletion layer extending from the deep layer 185 in the semiconductor layer 130 can easily reach the buried layer 140. Consequently, when a high voltage is applied to the drain electrode, a breakdown occurs in the junction between the deep layer 185 and the semiconductor layer 130 before it occurs in the LDMOS 10 in the first drift region. Thus, the fourth embodiment can also produce effects similar to those of the first embodiment.

Figure 6:
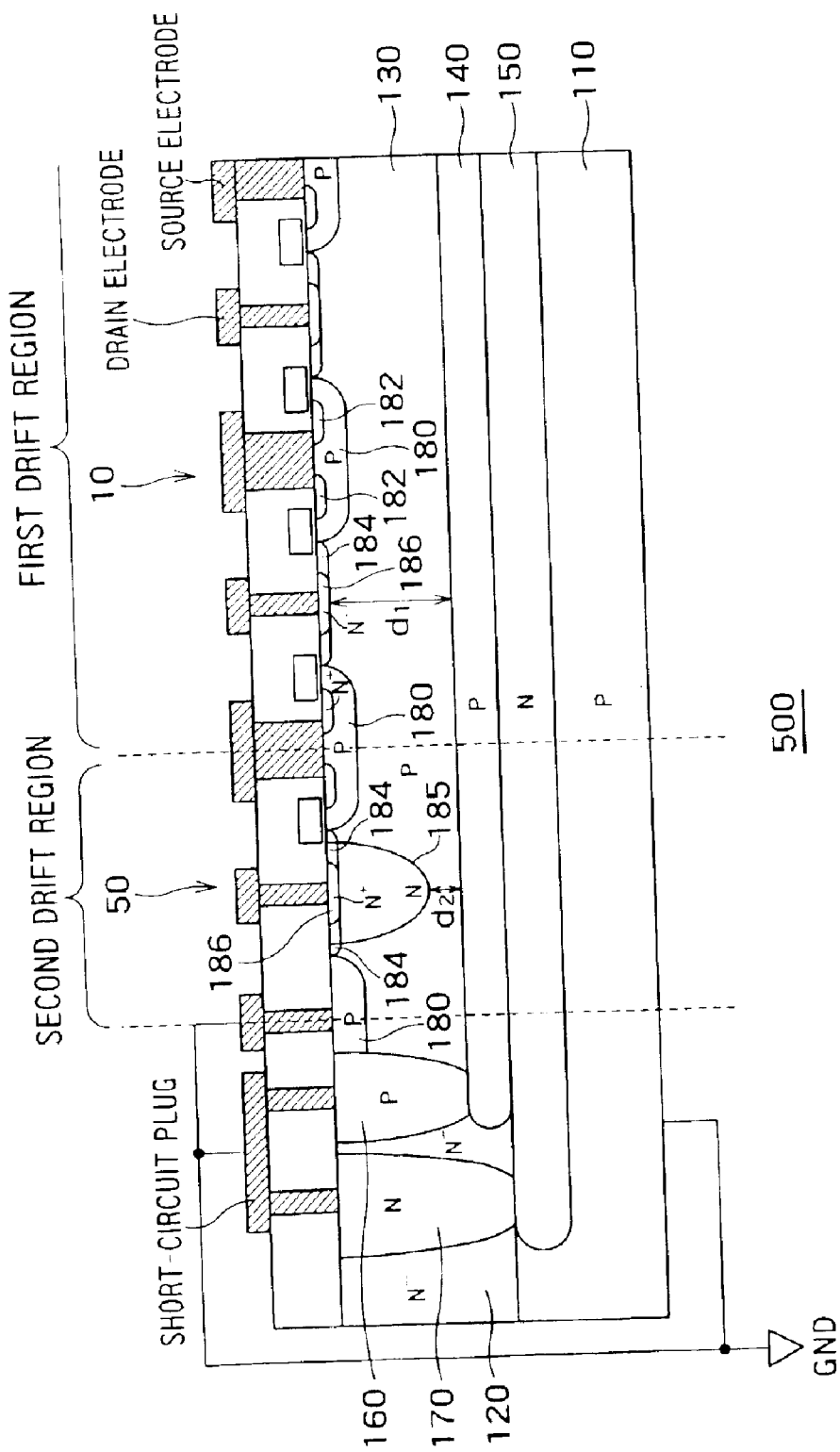
FIG. 6 is a cross section of a semiconductor device 500 according to a fifth embodiment of the invention.

FIG. 6 is a cross section of a semiconductor device 500 according to a fifth embodiment of the invention. The fifth embodiment is different from the fourth embodiment with respect to the point that no gate electrode is formed in the second drift region. The other elements are similar to those of the fourth embodiment. The semiconductor device 500 of the fifth embodiment operates in a manner similar to the semiconductor device 400 of the fourth embodiment.

Therefore, the fifth embodiment also produces effects similar to those of the first embodiment.

The LDMOS region in each of the first to fifth embodiments has a shape in plan view as shown in FIG. 1 but is not limited to such a shape.

Figure 7:
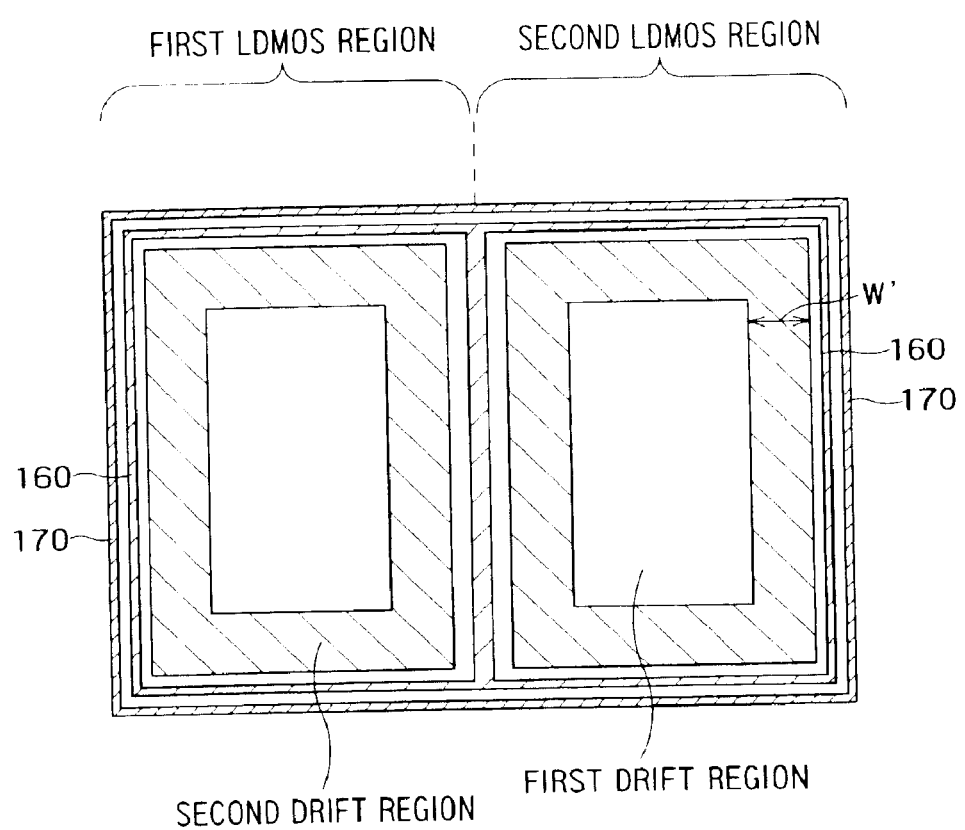
FIG. 7 is a plan view of an LDMOS region according to an embodiment different from FIG. 1.

For example, as shown in FIG. 7, the LDMOS region may be divided into a first LDMOS region and a second LDMOS region. The number of regions obtained by dividing the LDMOS region is not particularly limited but it is preferable that the second drift region in each LDMOS region be surrounded by the P-type connection region 160.

As shown in FIG. 7, the width of the second drift region may be set to W' which is wider than the width W shown in FIG. 1. With respect to the number of the LDMOSs or diodes formed in the second drift region, only one LDMOS or diode may be formed in an closest area to the connection region 160, or a plurality of LDMOSs or diodes may be formed near the connection region 160.

The deep layer 185 provided in the second drift region in the fifth embodiment may be formed in only one LDMOS closest to the connection region 160 or in each of a plurality of LDMOSs provided near the connection region 160.

Each of the semiconductor devices in the first to fifth embodiments has the N-type buried layer 150 and the N-type connection region 170. However, the N-type buried layer 150 and the N-type connection region 170 are not always indispensable elements. A form which does not include the elements can also produce the above-described effects.

Even when the conduction types of the elements in the foregoing embodiments are changed, the effects are not lost.

In the semiconductor devices according to the foregoing embodiments, unavailable current can be reduced and the substrate current can be suppressed.

What is claimed is:

1. A semiconductor device comprising:
   a semiconductor substrate having a main surface;
   a semiconductor layer of a first conduction type provided on the main surface of said semiconductor substrate;
   a first buried layer of the first conduction type provided between said semiconductor layer and said semiconductor substrate;
   a first connection region of the first conduction type provided in an inner edge of said first buried layer, said first connection region extending from the surface of said semiconductor layer to said first buried layer;
   a switching element provided in the surface region of said semiconductor layer on said first buried layer; and
   a low breakdown-voltage element provided in a surface region of said semiconductor layer, said low breakdown-voltage element being closer to said first connection region than said switching element and having a lower breakdown voltage than that of said switching element.

2. The semiconductor device according to claim 1, further comprising:
   a second buried layer of a second conduction type provided between said first buried layer and said semiconductor substrate, said second buried layer being provided adjacent to the first buried layer; and
   a second connection region of the second conduction type provided in an inner edge of said first connection region, said second connection region extending from the surface of said semiconductor layer to said second buried layer.

3. The semiconductor device according to claim 2, wherein said first and second connection regions are electrically connected to each other.

4. The semiconductor device according to claim 1, wherein said switching element is a lateral-type semiconductor device comprising:
   a first base layer of the first conduction type provided in the surface region of said semiconductor layer;
   a first source layer of said second conduction type provided in the surface region of said semiconductor layer in said first base layer;
   a first field relaxation layer of the second conduction type provided in the surface region of said semiconductor layer, said first field relaxation layer being apart from said first source layer;
   a first drain layer provided in the surface region of said semiconductor layer in said first field relaxation layer; and
   a first gate electrode formed on an insulating film which is provided on the surface of said semiconductor layer, said first gate electrode being provided between said first field relaxation layer and said first source layer.

5. The semiconductor device according to claim 4, wherein said low breakdown-voltage element includes:
   a second field relaxation layer of the second conduction type provided in the surface of said semiconductor layer, said second field relaxation layer being apart from said switching element; and
   a second drain layer of said second conduction type provided in the surface region of said semiconductor layer in said second field relaxation layer, and
   the length of said second field relaxation layer extending from an end of said second drain layer is shorter than the length of said first field relaxation layer extending from an end of said first drain layer.

6. The semiconductor device according to claim 5, wherein said low breakdown-voltage element is a lateral-type semiconductor device comprising:
   a second base layer of the first conduction type provided in the surface of said semiconductor layer;
   a second source layer of said second conduction type provided in the surface region of said semiconductor layer in said second base layer;
   said second field relaxation layer;
   said second drain layer; and
   a second gate electrode formed on an insulating film which is provided on the surface of said semiconductor layer, said second gate electrode being provided between said second field relaxation layer and said second source layer, and
   the length of said second field relaxation layer extending from an end of said second drain layer toward said second source layer is shorter than the length of said first field relaxation layer extending from an end of said first drain layer toward said first source layer.

7. The semiconductor device according to claim 5, wherein said low breakdown voltage element is a lateral-type semiconductor device comprising:
   a second base layer of the first conduction type provided in the surface region of said semiconductor layer;
   a second source layer of said second conduction type provided in the surface region of said semiconductor layer in said second base layer;
   said second field relaxation layer;

said second drain layer; and a second gate electrode formed on an insulating film which is provided on the surface of said semiconductor layer, said second gate electrode being provided between said second field relaxation layer and said second source layer, and the length of said second field relaxation layer extending from an end of said second drain layer to an end of said second gate electrode is shorter than the length of said first field relaxation layer extending from an end of said first drain layer to an end of said second gate layer.

8. The semiconductor device according to claim 5, wherein said low breakdown-voltage element is a diode which is composed of said second field relaxation layer and said semiconductor layer or which is composed of said second field relaxation layer and said second base layer and, the length of said second field relaxation layer extending from an end of said second drain layer is shorter than the length of said first field relaxation layer extending from an end of said first drain layer.

9. The semiconductor device according to claim 5, wherein said low breakdown-voltage element is a diode which is composed of said second field relaxation layer and said semiconductor layer or which is composed of said second field relaxation layer and said second base layer, and the length of said second field relaxation layer extending from an end of said second drain layer to an end of said second gate electrode is shorter than the length of said first field relaxation layer extending from an end of said first drain layer to an end of said first gate electrode.

10. The semiconductor device according to claim 4, wherein said low breakdown-voltage element includes:

a second field relaxation layer of the second conduction type provided in the surface of said semiconductor layer;

a second drain layer of said second conduction type provided in the surface region of said semiconductor layer in said relaxation layer; and a deep layer of said second conduction type provided in the surface region of said semiconductor layer in said second field relaxation layer, said deep layer being deeper than any of said first field relaxation layer, said second field relaxation layer, said first drain layer, and said second drain layer.

11. The semiconductor device according to claim 10, wherein said switching element near said first connection region includes the deep layer of the second conduction type which is provided in the surface region of said semiconductor layer and extends into said first field relaxation layer.

12. The semiconductor device according to claim 11, wherein said deep layer has a higher concentrations of said second conductivity type than said first and second field relaxation layers, said deep layers being diffused to almost the same depth as said first or second field relaxation layers.

* * * * *